United States Patent
Amro et al.

(10) Patent No.: US 10,252,463 B2
(45) Date of Patent: Apr. 9, 2019

(54) COMPACT INSTRUMENT WITH EXCHANGEABLE MODULES FOR MULTIPLE MICROFABRICATION AND/OR NANOFABRICATION METHODS

(71) Applicants: Nabil A. Amro, Prospect Heights, IL (US); Sandeep Disawal, Aurora, IL (US)

(72) Inventors: Nabil A. Amro, Prospect Heights, IL (US); Sandeep Disawal, Aurora, IL (US)

( * ) Notice: Subject to any disclaimer, the term of this patent is extended or adjusted under 35 U.S.C. 154(b) by 156 days.

(21) Appl. No.: 14/805,970

(22) Filed: Jul. 22, 2015

(65) Prior Publication Data

US 2016/0082647 A1    Mar. 24, 2016

Related U.S. Application Data

(60) Provisional application No. 62/027,676, filed on Jul. 22, 2014.

(51) Int. Cl.
| | |
|---|---|
| *B29C 59/02* | (2006.01) |
| *B29C 67/00* | (2017.01) |
| *B29C 64/00* | (2017.01) |
| *G03F 7/00* | (2006.01) |
| *G03F 7/20* | (2006.01) |
| *B33Y 30/00* | (2015.01) |

(52) U.S. Cl.
CPC ............ *B29C 64/00* (2017.08); *G03F 7/0002* (2013.01); *G03F 7/70991* (2013.01); *B33Y 30/00* (2014.12)

(58) Field of Classification Search
CPC ............ B29C 67/0059; B29C 67/0051; B29C 67/0066; G03F 7/70991; G03F 7/0002; B33Y 30/00
See application file for complete search history.

(56) References Cited

U.S. PATENT DOCUMENTS

| | | | |
|---|---|---|---|
| 5,143,663 A * | 9/1992 | Leyden | B29C 67/0066 118/423 |
| 5,772,905 A | 6/1998 | Chou | |
| 5,779,967 A * | 7/1998 | Hull | G03F 7/0037 264/308 |
| 5,900,160 A | 5/1999 | Whitesides et al. | |
| 5,918,189 A | 6/1999 | Kivela | |
| 7,034,854 B2 | 4/2006 | Cruchon-Dupeyrat et al. | |
| 7,199,305 B2 | 4/2007 | Cruchon-Dupeyrat et al. | |
| 7,279,046 B2 | 10/2007 | Eby et al. | |

(Continued)

OTHER PUBLICATIONS

Amro et al., U.S. Appl. No. 62/027,676, filed Jul. 22, 2014.

(Continued)

*Primary Examiner* — Nahida Sultana
(74) *Attorney, Agent, or Firm* — The Marbury Law Group, PLLC

(57) ABSTRACT

A device used as an instrument for microfabrication and/or nanofabrication featuring exchangeable module heads and multi-axis positioning of components. For example, a single module head can be adapted for carrying out photolithography, microcontact printing, and/or nanoimprint lithography. Another module head can be adapted to carry out different methods. The versatile device is used for training and is compact and relatively inexpensive. A working example for microcontact printing is provided.

15 Claims, 18 Drawing Sheets

(56) References Cited

U.S. PATENT DOCUMENTS

| | | |
|---|---|---|
| 7,491,422 B2 | 2/2009 | Zhang et al. |
| 7,622,367 B1 | 11/2009 | Nuzzo et al. |
| 7,799,699 B2 | 9/2010 | Nuzzo et al. |
| 8,039,847 B2 | 10/2011 | Nuzzo et al. |
| 8,067,265 B2 | 11/2011 | Zhang et al. |
| 8,069,782 B2 | 12/2011 | Fragala et al. |
| 8,252,223 B2 * | 8/2012 | Medina ............... B29C 67/0059 264/308 |
| 8,387,529 B2 | 3/2013 | Fragala et al. |
| 8,420,124 B2 | 4/2013 | Desimone et al. |
| 8,440,546 B2 | 5/2013 | Nuzzo et al. |
| 8,518,633 B2 | 8/2013 | Korbin et al. |
| 8,664,699 B2 | 3/2014 | Nuzzo et al. |
| 8,722,458 B2 | 5/2014 | Rogers et al. |
| 2003/0032214 A1* | 2/2003 | Huang ............... B29C 67/0059 264/435 |
| 2004/0175631 A1* | 9/2004 | Crocker ............... B82Y 10/00 430/5 |
| 2006/0022379 A1* | 2/2006 | Wicker ............... B29C 67/0066 264/255 |
| 2006/0198917 A1* | 9/2006 | Ho ............... B29C 59/022 425/174.4 |
| 2006/0246169 A1* | 11/2006 | Chen ............... B82Y 10/00 425/385 |
| 2009/0023607 A1* | 1/2009 | Rozhok ............... B82Y 10/00 506/30 |
| 2010/0021580 A1* | 1/2010 | Swanson ............... B29C 31/042 425/132 |
| 2010/0256824 A1 | 10/2010 | Val-Khvalabov et al. |
| 2011/0014378 A1 | 1/2011 | Bussan et al. |
| 2011/0024404 A1 | 2/2011 | Belletti |
| 2011/0195850 A1 | 8/2011 | Rozhok et al. |
| 2011/0268882 A1 | 11/2011 | Bussan et al. |
| 2012/0272845 A1 | 11/2012 | Loiret-Bernal et al. |
| 2013/0313744 A1* | 11/2013 | Maruyama ............ B29C 59/026 264/40.1 |
| 2015/0231827 A1* | 8/2015 | Uzan ............... B29C 67/0085 425/375 |
| 2016/0068793 A1* | 3/2016 | Maggiore ............... C12M 21/08 435/289.1 |
| 2016/0176120 A1* | 6/2016 | Skubic ............... B29C 67/0096 425/376.1 |
| 2016/0193785 A1* | 7/2016 | Bell ............... B33Y 10/00 264/255 |
| 2017/0165917 A1* | 6/2017 | McKiel, Jr. ........... B29C 64/386 |

OTHER PUBLICATIONS

Bucknall(ed.), Nanolithography and Patterning Techniques in Microelectronics, Elsevier (2005)—Table of Contents.

Torres et al., "Nanoimprint Lithography: An alternative Nanofabrication Approach", Materials Science and Engineering: C 23 (2003), pp. 23-31.

* cited by examiner

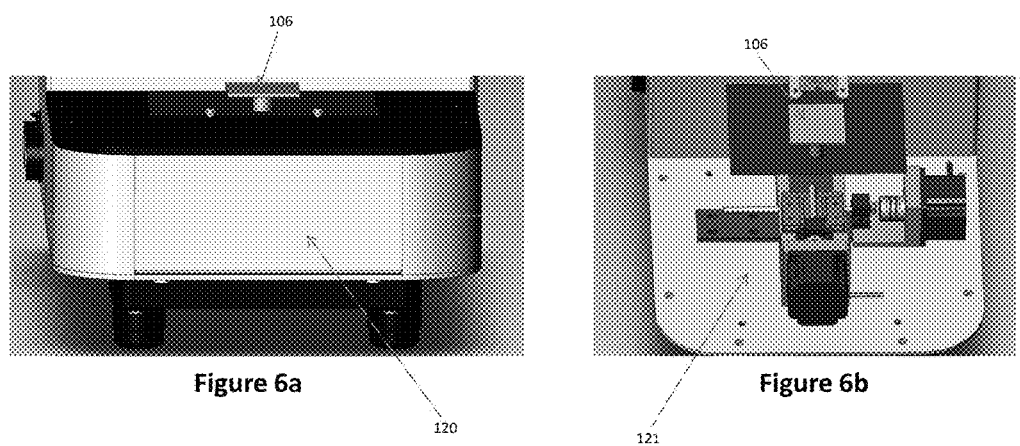

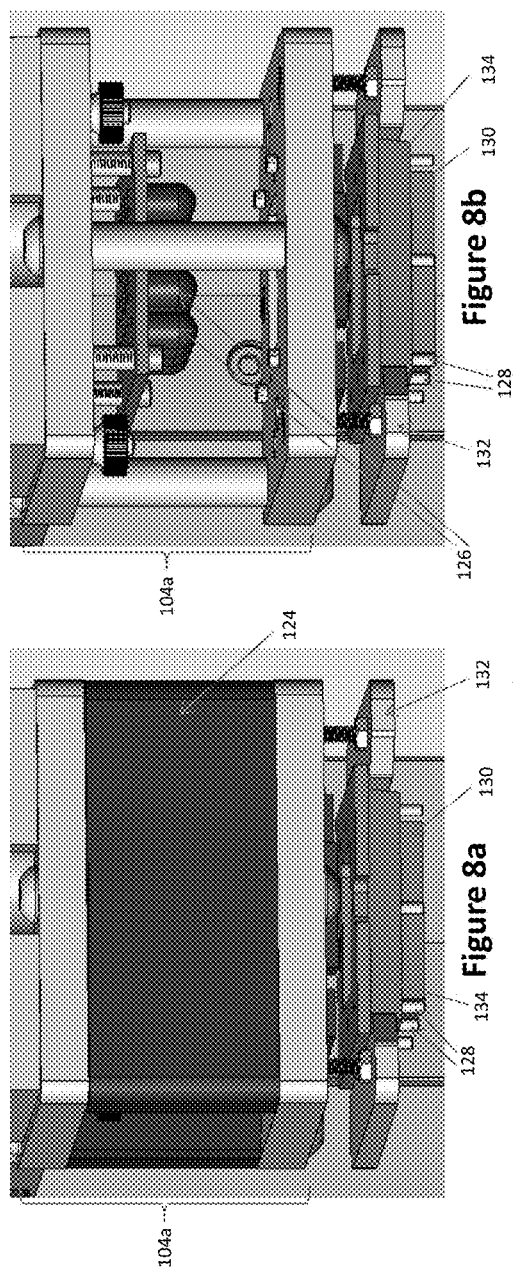
Figure 8a
Figure 8b
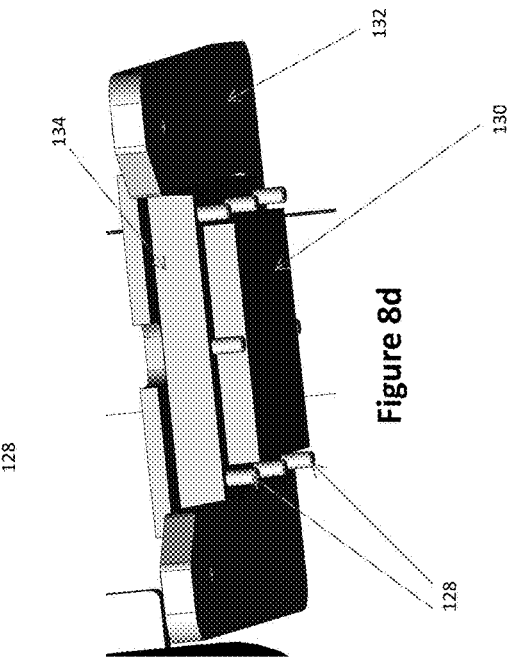
Figure 8c
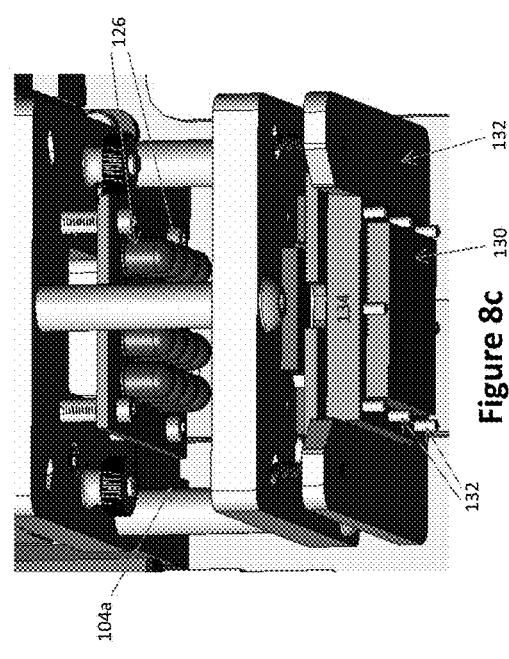
Figure 8d

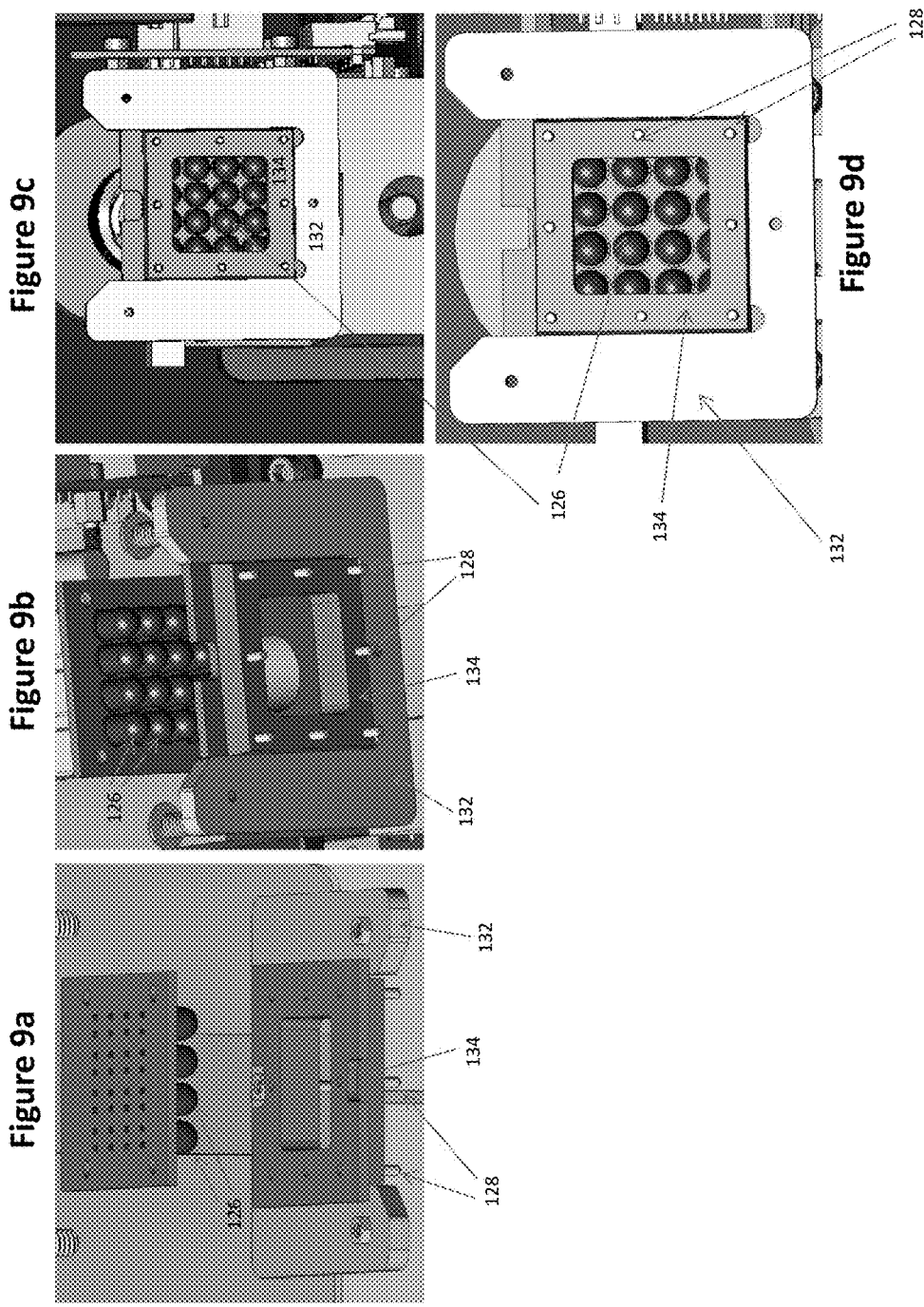

Assembled Device

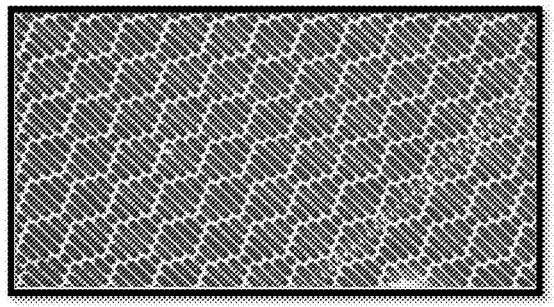
Figure 15a
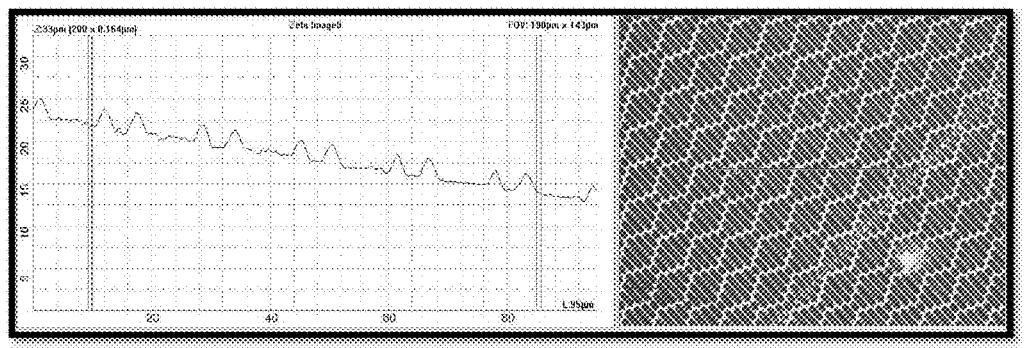
Figure 15b
Figure 15

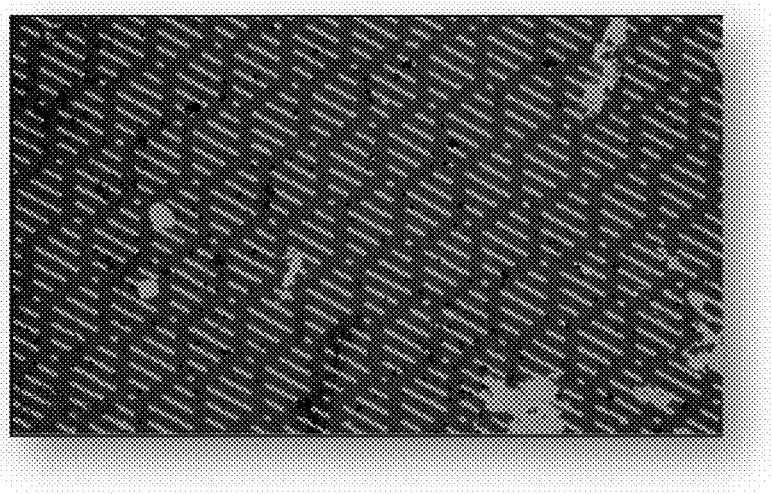
Figure 17a
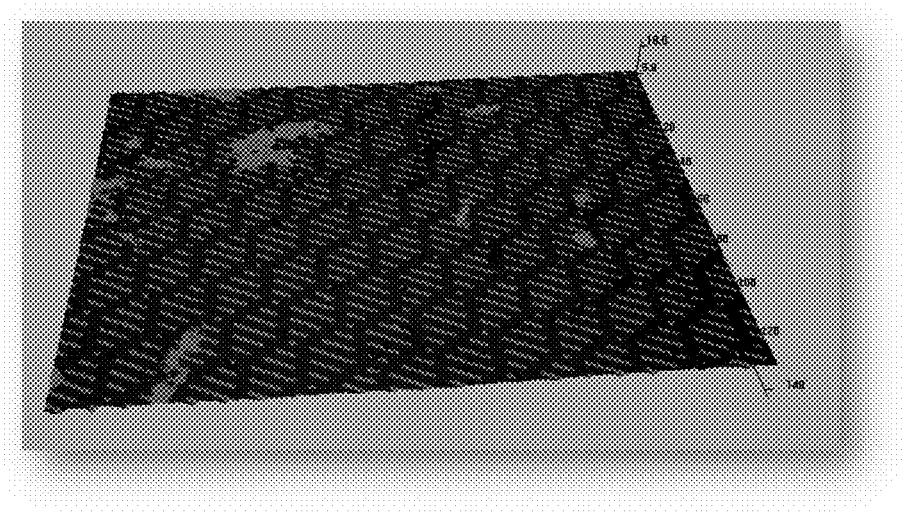
Figure 17b
Figure 17

COMPACT INSTRUMENT WITH EXCHANGEABLE MODULES FOR MULTIPLE MICROFABRICATION AND/OR NANOFABRICATION METHODS

RELATED APPLICATIONS

This application claims priority to U.S. Provisional Application Ser. No. 62/027,676 filed Jul. 22, 2014, which is hereby incorporated by reference for all purposes in its entirety.

BACKGROUND

Better instrumentation is needed to build smaller structures and components at the micro and nanoscale using instruments that are relatively low cost for use by, for example, smaller or non-profit institutions such as schools, four years colleges, startup companies, and the like. Such instruments are needed both for research and also to teach the student the art of micro and nanoscale fabrication for the next generation micro and nanotechnologist work force. Particularly important applications include, for example, having hands-on experience to design and build complex electronic circuits (used in our daily-life in many high-tech devices) or design and fabricate small biological structures for diagnostics. Unfortunately, many micro and nano techniques that already exist require expensive instrumentation or highly trained personnel which can be out of reach for too many organizations.

Some of the needs when building an instrument include, for example: (1) to be able to move and operate over longer distances without losing registration or interrupt the building process at the micro and nanoscale; (2) better alignment and higher resolution; (3) be able to use a majority of the instrument components in many micro and nanolithography techniques; (4) simple apparatus that is capable to do many techniques at low cost; (5) no need for high maintenance infrastructures; (6) versatile instrument that provides reliability, precision and ease-of-use; and/or (7) compact, relatively small instrument.

A need exists to provide such micro and nanofabrication instruments and devices, and associated components and methods of assembly and use. Also, a need exists to develop a versatile instrument ("all-in-one" instrument) that can do many micro and nano techniques such as, for example, photolithography, nanoimprint lithography (NIL) of various kinds including UV nanoimprint lithography, microcontact printing (μCP), hot embossing, hot nanoimprint lithography, micro-arraying, 2D UV lithography, 3D printing, stereolithography, scanning probe lithography (such as dip pen nanolithography, nanografting, nanoshaving, nanoindentation) and others, at a low costs.

SUMMARY

Embodiments provided herein include, for example, instruments, apparatuses, devices, modules, systems, method of using, methods of making, articles, hardware, software, kits, and the like.

A first aspect, therefore, is a microfabrication and/or nanofabrication device comprising a hardware platform with at least one multi-axis positioning stage including electronic control of the stage, wherein the hardware platform is also adapted to receive an exchangeable module head adapted to carry out at least one microfabrication and/or nanofabrication method.

Additional embodiments and advantages for at least some embodiments are summarized hereinbelow.

Provided herein, in one embodiment, is a scientific instrument primarily targeted for institutions (e.g., science and research) to facilitate education and enable research with various lithographic methods or techniques.

In some embodiments, the device comprises multi-axis stages, assemblies, or motors (e.g., XYZ) to travel or translate microscopic distances and provide for nano- and microscale fabrication with micro and nano positioning capabilities. This device can enable techniques which would otherwise require very costly setups, and large instruments. The device is specifically targeted to have a compact design to make it easy to use in a lab or classroom type setup.

At least one novel feature of this instrument, for example, will be its design flexibility that allows (or can be easily modified) multiple lithographic or fabrication techniques typically requiring separate instruments. The instrument, for example, is modular and can accommodate for different techniques within one hardware platform with the objective of making it an "all-in-one" instrument. This instrument, for example, will have modules heads that can be exchanged easily for different fabrication techniques (exchangeable module heads). Techniques that can be used with this instrument include and not limited to photolithography, UV nanoimprint lithography, microcontact printing, hot embossing, hot nanoimprint lithography, micro-arraying, 2D UV lithography, 3D printing, stereo lithography, scanning probe lithography (such as, for example: dip pen nanolithography, nanografting, nanoshaving, nanoindentation), and some of these techniques can be combined in one module. Each module will include certain components and features depending on the techniques to be implemented with that module. For example, for practice of photolithography, the module can contain UV source and mask assembly mounted on the Z-axis to bring the mask in close proximity of the substrate to be able to make pattern transfer from the mask to the photoresist coated sample. The device or apparatus can be encased with a cover for UV protection and safety from mechanical components. The multi-axis assembly can be 3-axis with encoders and controlled by a software to perform nano and micro fabrication using different techniques.

For example, one embodiment provides an instrument comprising: at least two axis-assemblies that include a multi-axis of at least two positioning stages, one axis of one positioning stage, multiple modules, at least one controller, encoders, load cell, amplifier and viewing assembly.

Another embodiment provides an instrument comprising: one multi-axis assembly of at least one stepper motor, one piezoelectric nanopositioning stage or one frictionless stage in X or Y axis, and similar at least one in Z axis stage, wherein a substrate is placed on the XY stage and the stages are enclosed with a chamber that can be used as an enclosed environment, a controller and viewing assembly.

Another embodiment provides accessories comprising: different modules in which at least each module can be used for multiple micro and nanotechniques mentioned above. For example a small photomask with size of a few mm to a few cm is placed on a mask holder on the z-axis to which a substrate is placed a affixed on the X-Y stage and positioned under the mask; the z-axis brings the mask into proximity to the substrate which is coated with photoresist and is exposed to UV light via LEDs that shine through the photomask onto the substrate. This procedure can be repeated by moving the substrate using the X-Y stage with high precision, and the distance between the mask and the surface should be carefully controlled in photolithography thus will control the pattern definition and quality. The pattern quality is controlled via the distance, the UV LED exposure time and LED intensities. The same module can be used to do UV-NIL (UV-nanoimprint lithography) using a transparent mask and coated substrate with photo curable resist. The mask is brought into contact with the substrate, self-leveled and pressed against the substrate using the z-axis with a defined load using a load cell, or a μCP (microcontact printing) stamp that is coated with material of interest (e.g., organic, inorganic, biomaterial, etc.) and pressed against a chemically or none modified substrate to deliver material from the stamp to the substrate with spatial positioning using the XY-stage. For μCP and NIL, the load should be sufficient to create the desired pattern transfer, and the load can be controlled via the extension of z-axis and springs and monitored by a load cell. The quality for these two techniques depends on the load and time in contact. Another module which has a heating element that heats up a stamp that is brought in contact with a substrate or sample that it can be deformed under heat (e.g., 25 to 200° C.) and pressure (e.g., few grams to several kilograms) or bring into contact with the substrate a transparent or opaque mask that has a resist that can be thermally cured to form micro or nanostructures (thermal NIL). The load is controlled via a load cell and some associated electronics. Similarly different modules can be used with specific elements to fabricate micro or nanostructures using different techniques such as and not limited to micro-arraying, 2D UV lithography, 3D printing, stereo lithography, scanning probe lithography, etc.

This versatile instrument has various advantages over any existing single technique instrument in the market because it can be an "all-in-one" instrument for various micro and nanotechniques which has the capability to operate at macroscale movements with nanoscale resolution and registration, reliable, low cost, compact, and versatile in terms of combining many micro and nanofabrication techniques into one apparatus. It has the advantages of many combined instrument into one-single-compact instrument. Micro and nanoscale structures, chips, circuits, molds and bio arrays can be fabricated over cm square areas with nanometer resolution.

In other words it is useful for small scale fabrication and nano- & micro-lithography. It is versatile, compact, small and has the ability to functions and fabricate using different techniques in the same apparatus. There is a wide need for the development of an apparatus that can be used in different fabrication techniques for education and research purpose at a small scale, to make structures or circuits and bioarrays or 2D and 3D structures and devices that need expensive equipments to fabricate.

One aspect of the versatility is the ability and ease to switch between micro and nanoscale techniques. For example, one is able to use photolithography to fabricate a circuit and then be able to switch to use NIL or μCP "on the fly" to modify or add to the circuit, which might be difficult to achieve with existing instrumentations.

In addition, particularly claimed embodiments include:

One embodiment provides for a microfabrication and/or nanofabrication device comprising a hardware platform with at least one multi-axis positioning stage including electronic control of the stage, wherein the hardware platform is also adapted to receive an exchangeable module head adapted to carry out at least one microfabrication and/or nanofabrication method.

In one embodiment, the device further comprises a cover for the hardware platform for, for example, UV protection and safety from mechanical components.

In one embodiment, the microfabrication and/or nanofabrication method comprises at least one of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least one of photolithography, UV nanoimprint lithography, and/or microcontact printing.

In one embodiment, the microfabrication and/or nanofabrication method comprises at least one of hot embossing and/or hot nanoimprint lithography.

In one embodiment, the microfabrication and/or nanofabrication method comprises at least one of 3D printing and stereolithography.

In one embodiment, the microfabrication and/or nanofabrication method comprises at least two of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least three of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least scanning probe lithography, wherein the scanning probe lithography comprises, for example, at least one of dip pen nanolithography, nanografting, nanoshaving, and/or nanoindentation.

In one embodiment, the microfabrication and/or nanofabrication method comprises photolithography, and the module comprises at least one UV source and at least one mask assembly.

In one embodiment, the microfabrication and/or nanofabrication method comprises one or more kinds of tip bias or atomic force microscope (AFM) bias lithographies in which the tip can refer to a nanoscopic or an AFM type of tip. Nanoscopic and AFM tips are known in the art, including methods for biasing the tips positively or negatively.

In one embodiment, the at least one multi-axis positioning stage comprises at least three axes for positioning. In one embodiment, the at least one multi-axis positioning stage includes a z-axis stage and an x-y stage.

In one embodiment, also provided are rotation and/or tilt modes in addition to the x-, y-, and/or z-modes. Rotation and/or tilt modes can be useful in, for example, alignment and/or leveling. Hence, better leveling can be carried out with tilt and/or rotational modes compared to mere self-leveling. See, for example, US patent publications 2011/0268882; 2011/0014378; and 2011/0195850 which relate to instrumentation and leveling.

In one embodiment, the device further comprises at least one encoder. In one embodiment, the device further comprises at least one amplifier. In one embodiment, the device further comprises a viewing assembly. In one embodiment, the device further comprises a load cell. In one embodiment, the device further comprises at least one LED. In one embodiment, the device further comprises a camera.

Another embodiment is for the exchangeable module head. One embodiment, for example, provides an exchangeable module head which, when used in conjunction with a microfabrication and/or nanofabrication device as described and claimed herein, is capable of performing at least one microfabrication and/or nanofabrication technique. In other words, provided herein in one embodiment is an exchangeable module head adapted to perform at least one nanofabrication and/or microfabrication method.

In one embodiment, the exchangeable module head is capable of being used to perform at least one microfabrication and/or nanofabrication technique such as, for example, at least one of: photolithography, UV nanoimprint lithography, microcontact printing, hot embossing, hot nanoimprint lithography, micro-arraying, two-dimensional UV lithography, three-dimensional printing, stereo lithography, or scanning probe lithography. Alternatively, the methods can be at least one microfabrication and/or nanofabrication technique comprising at least two of: photolithography, UV nanoimprint lithography, microcontact printing, hot embossing, hot nanoimprint lithography, micro-arraying, two-dimensional UV lithography, three-dimensional printing, stereo lithography, or scanning probe lithography. In one embodiment, the at least one microfabrication and/or nanofabrication technique is comprised of hot embossing and hot nanoimprint lithography. In one embodiment, the exchangeable module head is adapted, wherein the at least one microfabrication and/or nanofabrication technique is comprised of at least three of: photolithography, UV nanoimprint lithography, microcontact printing, hot embossing, hot nanoimprint lithography, micro-arraying, two-dimensional UV lithography, three-dimensional printing, stereo lithography, or scanning probe lithography. In one embodiment, the at least one microfabrication and/or nanofabrication technique is comprised of photolithography, microcontact printing, and nanoimprint lithography.

Another embodiment is a method of microfabrication and/or nanofabrication, comprising engaging the device for microfabrication and/or nanofabrication, as described and claimed herein, with the exchangeable module head and carrying out the microfabrication and/or nanofabrication. In one embodiment, the method further comprises using software to direct the device and exchangeable module head to perform at least one microfabrication and/or nanofabrication technique. In one embodiment, the method further comprises inserting the exchangeable module which can be a first exchangeable module. In one embodiment, the method further comprises engaging the device as described and claimed herein with a second, different exchangeable module head.

BRIEF DESCRIPTION OF THE FIGURES

The following figures illustrate exemplary, non-limiting embodiments.

FIG. 6 (a-b) provides, for one embodiment, engineering illustrations of the XY axis assembly (a) with covers, and (b) no cover.

FIG. 8 (a-d) provides, for one embodiment, engineering illustrations of one module to perform photolithography, NIL, and μCP (a) module with protection cover, (b) module without protection cover showing the UV LEDs, (c) side view showing the stamp and stamp holder, and (d) view of the stamp holder, the stamp, pins for height adjustment during photolithography, and the float plate for passive leveling of the stamp assembly.

FIG. 9 (a-d) provides, for one embodiment, illustrations of the module showing only the LEDs assembly, stamp holder and float plate (a) front view, (b) tilted view, (c) bottom view showing the opening of the stamp holder for UV light access (d) zoom view with descriptions.

FIG. 15 (a-b) shows an embodiment for microcontact printing of a cured PDMS (polydimethylsiloxane) stamp generated from a plastic sheet used as a mold.

FIG. 17 (a-b) shows for an embodiment fabricated structures on gold substrate after etching using a PDMS stamp fabricated using a plastic sheet.

DETAILED DESCRIPTION

Introduction

Figure 1:
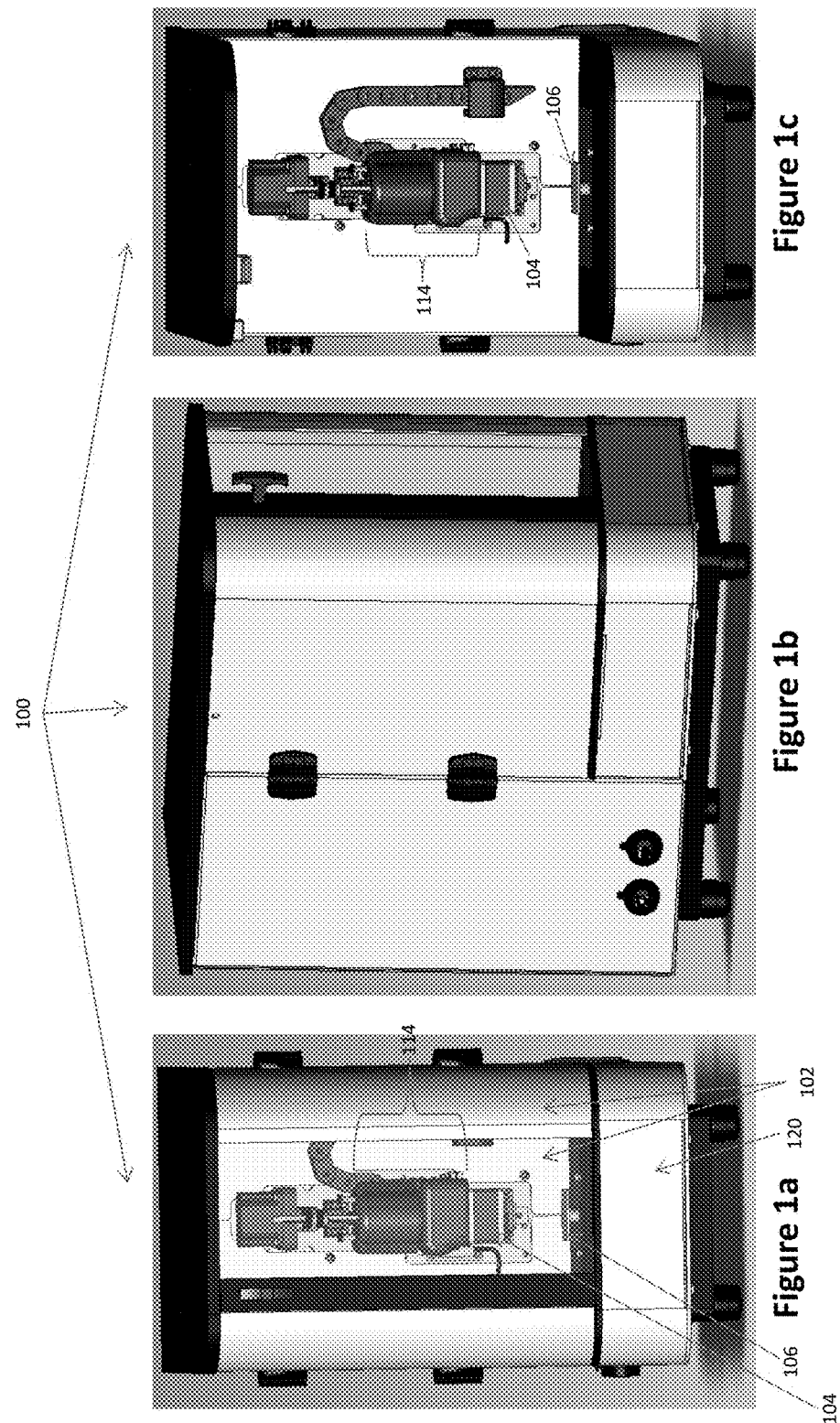
FIG. 1 (a-c) provides, for one embodiment, engineering illustrations of the instrument (a) front view with enclosure, (b) side view, and (c) front view with no enclosure around the multi-axis stages.

One skilled in the art who has experience building instruments can use known components, software, hardware, electronics, cable, encoders, power supplies, machining, cables, and the like.

Instrumentation for carrying out microfabrication and/or nanofabrication are known. See, for example, US Patent Publications 2009/0023607; 2010/0256824; and 2012/0272845. Serial and parallel fabrication processes can be used. Direct write and/or stamping methods can be used.

Hardware Platform

The instrument can comprise a hardware platform upon which other components are based. The hardware platform can be designed to provide a stationary instrument which is compact and can be used on a normal laboratory bench or engineering workspace. It provides a mechanical base or support. In addition, the hardware platform can provide for, for example, electrical connections, as well as material connections which provide gases, liquids, and/or vacuum, for example. The hardware platform is adapted to receive other components described herein such as the multi-axis assembly and the exchangeable module head. The stationary hardware platform of the instrument is adapted to be used with removable module heads described further hereinbelow. Information, labels, and identification can be placed on the hardware platform for the user and/or owner.

Multi-Axis Assembly

This instrument comprises at least one multiple axis assembly that can provide at least three dimensions of motion; the stages can be operated independently or in conjunction. The motions are laterals using X, Y and verticals using Z axis (Z axis is above the XY plane that can come into contact with the plane or have a gap). Additional motions can be tilt in X and Y directions and also rotational motion. These axis stages, known as positioning stages, can be micropositioning or nanopositioning systems and can be made from a variety of materials and components know in the art using various methods for movement and actuation such as servo motors, piezoelectric, electrostatic, frictionless stages, electromagnetic etc.

In addition, the multi-axis assembly can provide for rotational and/or tilt modes of motion creating fourth and fifth dimensions of motion to use as needed.

These stages can be driven by commercial controllers. These stages can displace or move objects in nanometer or micrometer range at slow or fast speeds, it can go 100 nm/sec or 40 cm/sec and have a resolution that varies from 10 to 200 nm. These linear or vertical stages can provide a motion from 10 mm to 100 mm in any direction which will cover at least a 10,000 square mm. In order to maintain an accurate position, each axis can be used with one optical encoder or similar device.

The apparatus, in addition, can have a load cell and amplifiers for load and feedback control for when the mask or stamp holder is in contact with the substrate. The load can be varied from at least a few grams to 10 kilograms, and it is part of the main assembly and not the module and can be used for different module. The load exerted onto a desired sample can be controlled via software; software also similarly can be used for controlling the intensity and exposure time of light, e.g., the UV-LEDs. Also the doors on the apparatus can have switch locks for safety operations. These motors and encoders are controlled by a multichannel controller. The hardware can be controlled by customized software.

Exchangeable Module Heads

The apparatus can be used with multiple module heads, and each of the modules can perform at least one or more nano or micro fabrication techniques such as, for example and not limited to, photolithography, UV nanoimprint lithography, microcontact printing, hot embossing, hot nanoimprint lithography, micro-arraying, 2D UV lithography, 3D printing, stereolithography, scanning probe lithography (such as: dip pen nanpolithography (DPN), nanografting, nanoshaving, nanoIndentation), and the like. Each module can comprise, for example, various components such as, for example, UV LEDs, heating elements, bright LEDs, etc., a mask holder, a stamp holder, a probe holder, or a delivery device holder (e.g., for liquid delivery).

The modules can be adapted to carry out nanolithography and other patterning techniques. See, for example, D. Bucknall, *Nanolithography and Patterning Techniques in Microelectronics*, 2005. Methods include, for example, soft lithography, ion beam patterning, nanostencils, photolithography, inkjet printing, and block copolymer nanolithography.

Other patterning methods and devices can be found in, for example, 2004/0175631; 2009/0023607; U.S. Pat. Nos. 5,772,905; 5,900,160; 7,491,422; 7,034,854; 7,199,305; and 7,279,046.

Other examples including the methods and devices found in, for example, U.S. Pat. No. 8,722,458—"Optical systems fabricated by printing-based assembly" (Printing techniques); U.S. Pat. No. 8,664,699—"Methods and devices for fabricating and assembling printable semiconductor elements" (Printing techniques); U.S. Pat. No. 8,518,633—"Large area nanopatterning method and apparatus" (Photo/nanolithography); U.S. Pat. Nos. 8,387,529/8,069,782—"Stamps with micrometer- and nanometer-scale features and methods of fabrication thereof" (Photolithography); U.S. Pat. No. 8,067,265—"Electric devices and methods of manufacturing the same" (Photolithography); U.S. Pat. Nos. 7,622,367/8,440,546-"Methods and devices for fabricating and assembling printable semiconductor elements" (Soft lithography); U.S. Pat. No. 8,420,124—"Methods for fabricating isolated micro- and nano-structures using soft or imprint lithography" (Soft or imprint lithography; not both at once); U.S. Pat. Nos. 7,799,699/8,039,847—"Printable semiconductor structures and related methods of making and assembling" (uses photolithography or soft lithography; not both at once); U.S. Pat. No. 7,491,422—"Direct-write nanolithography method of transporting ink with an elastomeric polymer coated nanoscopic tip to form a structure having internal hollows on a substrate" (nanolithography and micro-contact printing); U.S. Pat. No. 5,772,905—"Nanoimprint lithography" (Nanolithography); 2004/0175631—"Additive and subtractive correction using direct write nanolithography; fine control over lateral dimensions and height" (Nanolithography); and Torres et. al. "Nanoimprint Lithography: An Alternative Nanofabrication Approach." *Materials Science and Engineering: C* 23.1-2 (2003): 23-31.

The substrates, materials, inks, stamps, masks, and the like for these microfabrication and/or nanofabrication methods are known in the art.

The module heads are exchangeable. Exchangeable modules are known in the art, albeit for different applications. See, for example, US Patent Publication 2011/0024404 and U.S. Pat. No. 5,918,189. In the present application, for example, magnets can be used for pre-alignment with the rest of the instrument so it can be securely fastened to the Z-axis assembly, and each module has its own interfacial plug that plugs into the interface board. Screws or other fastening devices can be used to further mechanically secure the exchangeable module head. The exchange can be a simple replacement. Removal and replacement can be carried out.

One can have, for example, a first exchangeable module head, a second exchangeable module head, a third exchangeable module heard, and so forth, each module head being different.

Enclosure

The instrument can be enclosed for safety during heat, UV, and mechanical movement, this enclosure also protect all the precision axis and components from the environment such as dust or particulates, also to prevent the substrates from getting contamination from the environment. Housings are known in the art; viewing can be carried out via openings.

Sample Holder

The apparatus can also comprise a sample holder, to hold in place a variety of samples with different sizes and shape that are, for example, blank, coated with polymer or photo resists or just chemically modified. Samples can be hold in place mechanically to prevent movement or lifting when a stamp or a mask is in contact with the substrate. The substrate can be made from any type of solid materials such as metals, glass (e.g., pyrex), polymer, ceramic, alloys, composite, etc. or soft and flexible made from polymers and such. The machine can also comprise a viewing assembly with a long working distance (small camera with or without optics) especially to be use with the liquid printing polymer, the 3D printing module or with the photolithography for multiple mask alignment etc, images can be captured or recorded.

Encoders

Encoders can be used in conjunction with some or all of the high resolution motors to guarantee registration and resolution and enable alignment during multiple fabrication layers using the same technique or different technique.

Load Cell

The device can employ feedback from a load cell to apply known load or detect its position with reference to the surface. This is an important attribute for many techniques including micro contact printing, NIL, embossing, etc. The feedback from the load cell could also be used to prevent accidental damage and ensure safety during operation. Also, it would be used to determine z positions within a plane for the 2D photolithography and any scanning probe lithography techniques.

Viewing Assembly

Viewing assemblies can be provided to allow for better viewing of the processes and components. Transparent materials can be used including, for example, glass or plastic materials.

Source of Radiation or Light for Photolithography

Sources of radiation or light for photolithography are well known in the art. UV light and UV-Vis light are important examples.

Camera

The equipment if desired can be fitted with a camera to enable optical positioning or just plain visualization of operations from different angles.

Also important is that different components described herein can be sold together as "kits" wherein the different components function together and instructions are provided to the user on how to make and use the instrument. The device or instrument can be assembled by methods known in the art.

Application Examples

Seven representative application examples are noted below which can be used in various combinations as desired in the exchangeable modules:

1—Photo lithography: example is electronic circuit;
2—µCP: example is for templating variety of bio-materials;
3—NIL: an example is for hard disc fabrication;
4—Hot Embossing: example is to fabricate nanostructures in variety of materials;
5—2D lithography: example is designing masks, stamps and circuits;
6—3D printing: example is to make cost effective prototypes and working models;
7—Micro-arraying: example is to create high density arrays for proteins, peptides, nucleic acids and polymers thereof, DNA, RNA, antibodies, etc.

EXAMPLE

Examples are provided for a multi-axis instrument with at least 3-axes and various modules adapted to do different micro and nano techniques that are know in the art such as and not limited to photolithography, UV nanoimprint lithography, microcontact printing, hot embossing, hot nanoimprint lithography, micro-arraying, 2D UV lithography, 3D printing, stereo lithography, scanning probe lithography (such as: dip pen nanpolithography, nanografting, nanoshaving, nanoIndentation) etc., The instrument can travel in XY for at least 70 mm in either direction and similarly in the Z vertical direction with high precision and accuracy for 100 nm or better to 10 nm using encoders and different type of stages. Many vendors known to the skilled artisan can be used to fabricate such axis with these specification and precision.

FIG. 1(a-c) is an engineering illustration of the instrument that include the enclosure around the multi-axis stage assembly and electronics.

Figure 2:
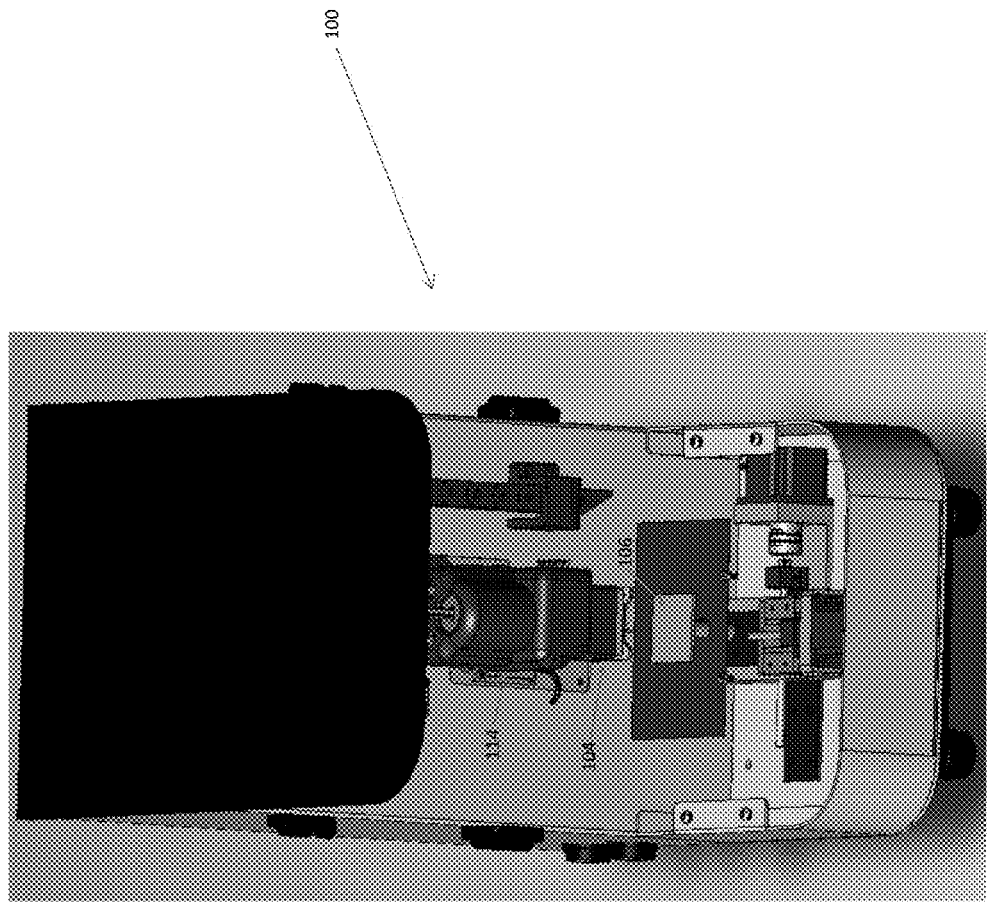
FIG. 2 is, for one embodiment, an engineering illustration of the instrument showing the three axis XYZ, sample stage, and module.

FIG. 2 illustrate an embodiment of the instrument showing the three axis XYZ, sample stage and a module, with all the electronic, mechanical, cabling and fixtures.

Figure 3:
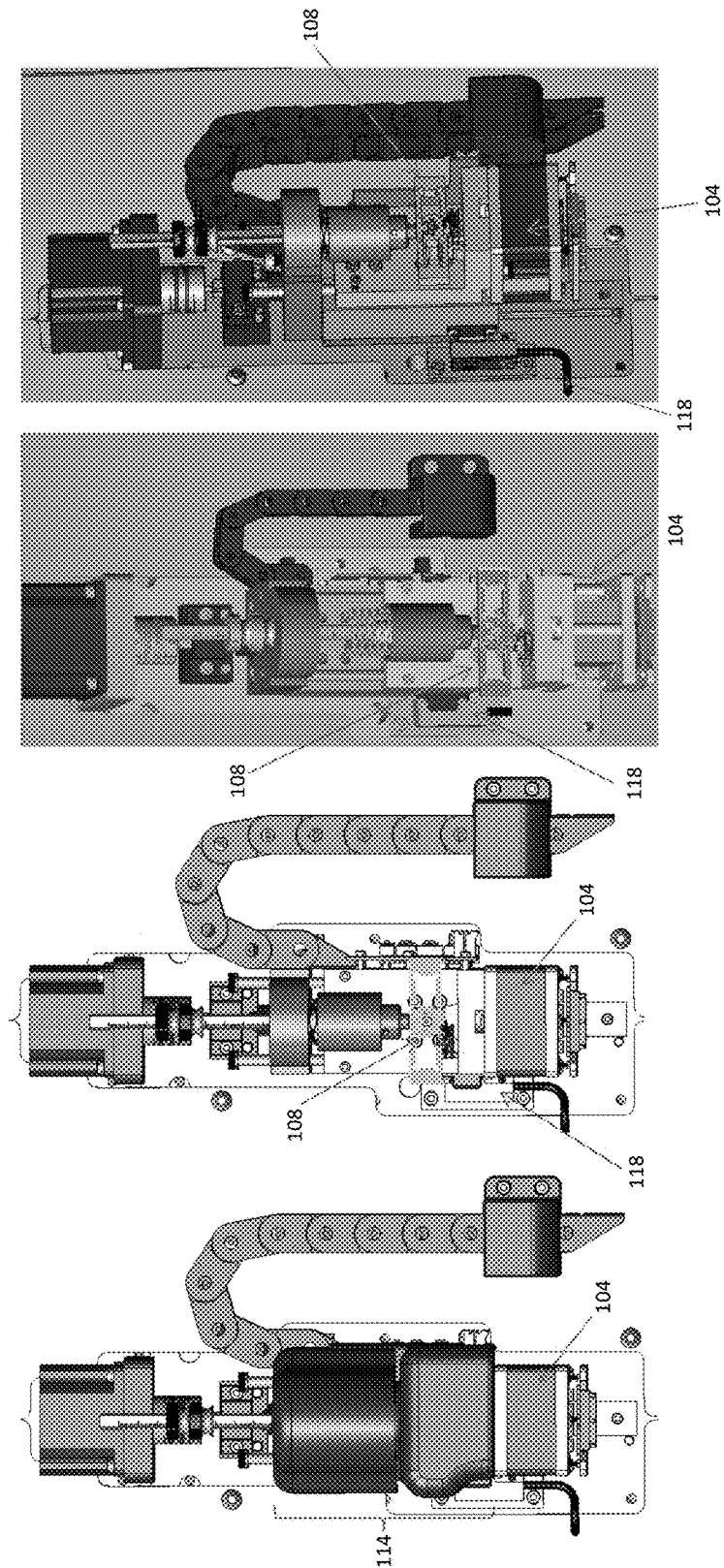
FIG. 3 (a-d) provides, for one embodiment, engineering illustrations of the Z-axis assembly and its components, (a) front view of covered z-axis assembly, (b) front view without the covers and z in retracted states, (c)) front view without the covers and z in extended states, and (d) side view of the Z-assembly and its components.

FIG. 3 shows an embodiment of the Z-axis assembly and its components in different views when the Z-axis is extended or retracted.

Figure 4:
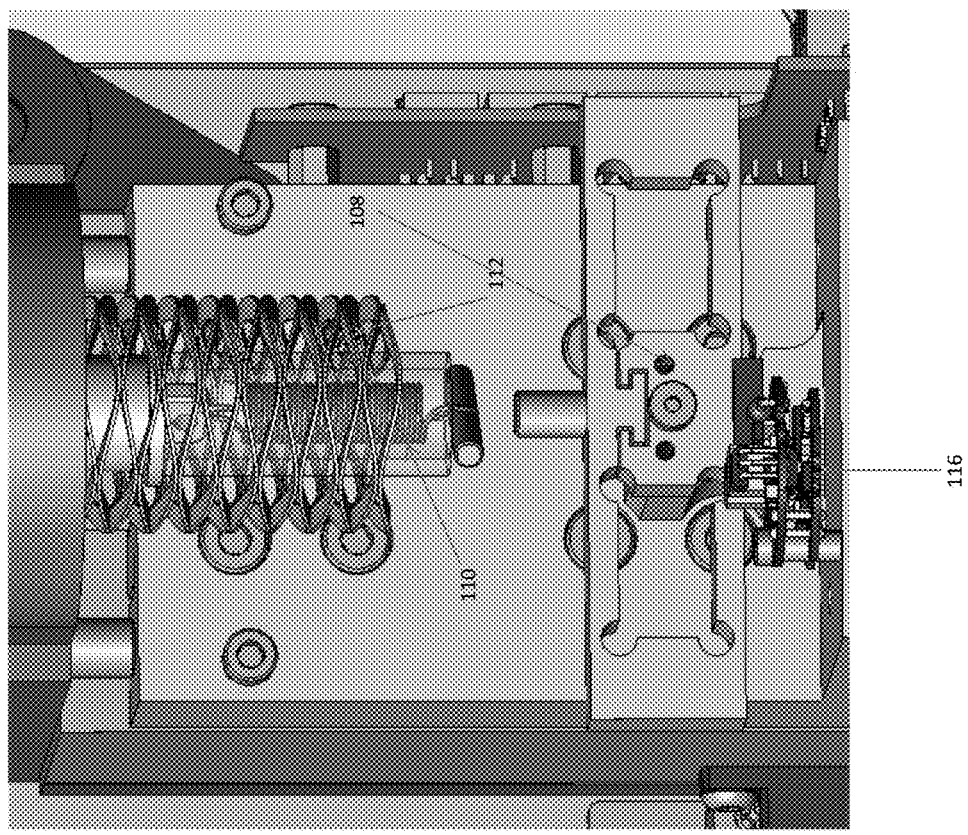
FIG. 4 is, for one embodiment, an engineering illustration of the load cell, springs, and corresponding electronics.

FIG. 4 shows an embodiment of the assembly of the load cell, springs and corresponding electronics, and illustrates how it is mounted on the Z-axis.

Figure 5:
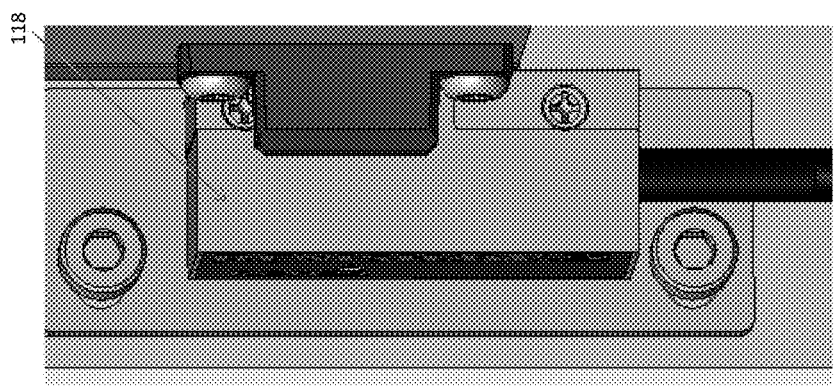
FIG. 5 is, for one embodiment, an engineering illustration of a 10 nm resolution encoder (from Renishaw, PLC).

FIG. 5 illustrates a 10 nm resolution encoder from Renishaw, different encoders can be used such as the nanoencoder or the absolute encoder.

FIG. 6 shows an enclosure assembly of the XY axis assembly, the enclosure comprises of sheet metal on aluminum stage plate.

Figure 7A:
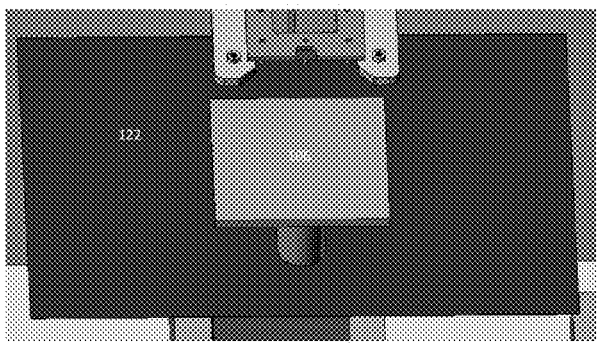
FIG. 7 (a-b) provides, for one embodiment, engineering illustrations of the sample stage (a) sample stage and protection cover, and (b) sample stage.
Figure 7B:
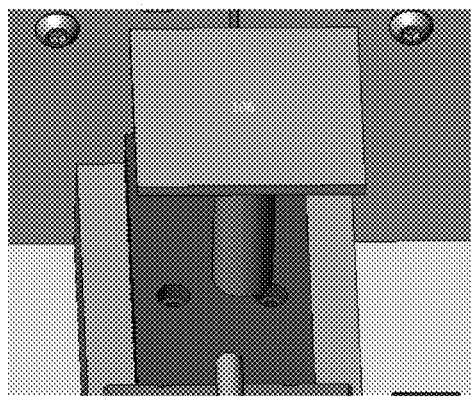

FIG. 7 shows a sample plate assembly mounted on top of the XY-axis stage assembly. A sample can be mounted on top of this assembly, and it can be rotated or affixed with a screw, a protection cover is placed between the sample stage and the stage plate.

FIG. 8 shows an embodiment of one module to perform photolithography, NIL and µCP, with all its components and surrounded by a cover sheet to prevent UV leakage.

FIG. 9 shows an embodiment of the module showing only the LEDs assembly, stamp holder and float plate. The stamp holder, stamp, and pins are designed in such a way for height adjustment, or spacing, during photolithography and the float plate for passive leveling of the stamp assembly.

Figure 10B:
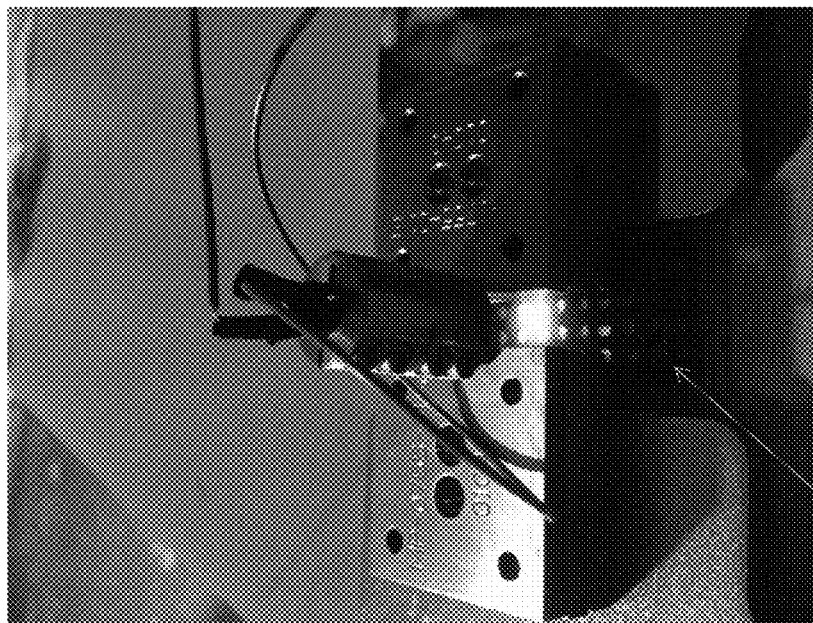
FIG. 10 (a-b) provides, for one embodiment, illustrations for test bed for the LED performance (a) an assembly for LED testing, (b) UV curable photo resist been cured with UV at different distances and time.
Figure 10A:
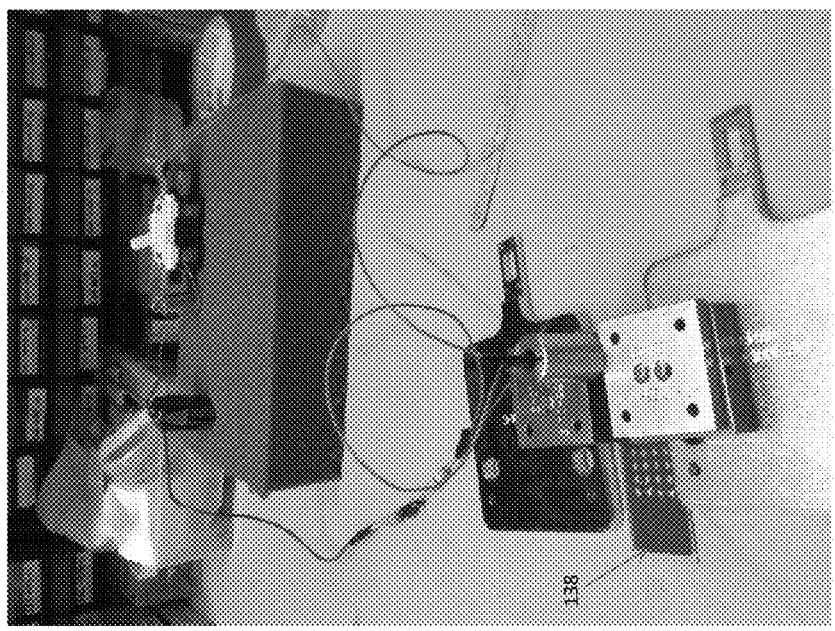

FIG. 10 shows a test bed for the LED performance using wiring and 9v batteries with resistors to attenuate the intensity to prevent the burning of the LED and a homemade switch. The UV curable photo resist can be cured with UV at different distances and time to obtain the optimum distance and exposure time at different intensities.

Figure 11C:
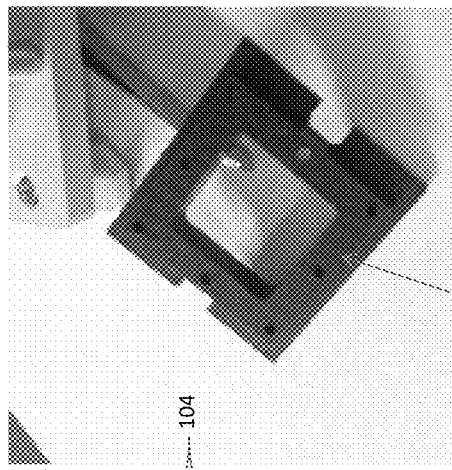
FIG. 11 (a-c) provides, for one embodiment, illustrations of a module 1 (a) module top view, (b) module front view, (c) stamp holder FIG. 12 (a-b) provides, for one embodiment, engineering illustrations of the LEDs setup (a) front view, (b) back view
Figure 11B:
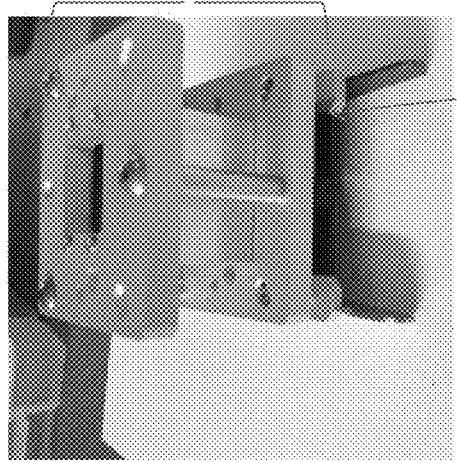
Figure 11A:
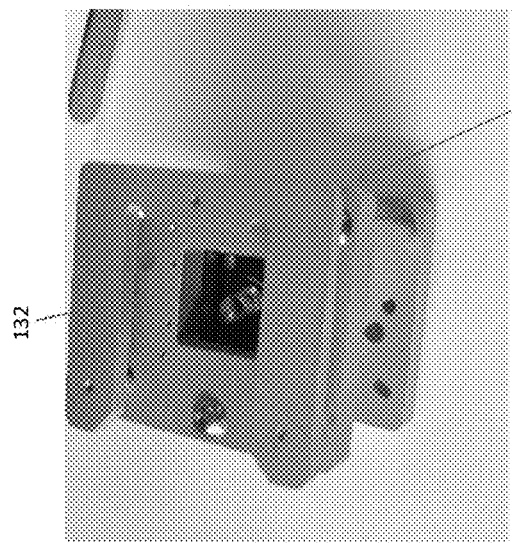

FIG. 11 shows an embodiment of the module 1 and stamp holder in different views.

Figure 12B:
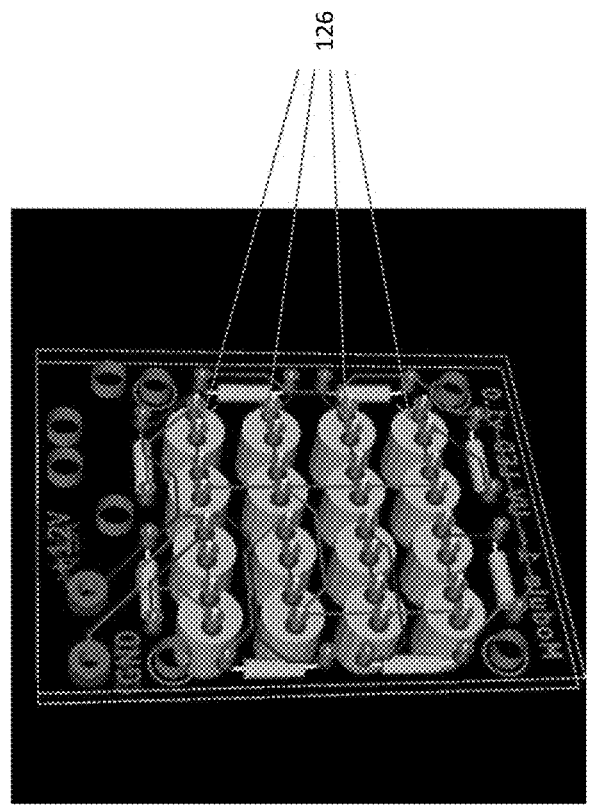
Figure 12A:
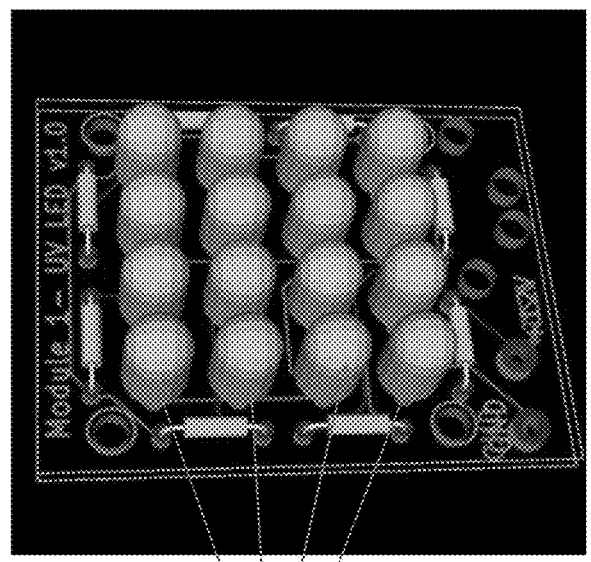

FIG. 12 shows a schematic of the LEDs setup and resistors on a PCB board.

Figure 13:
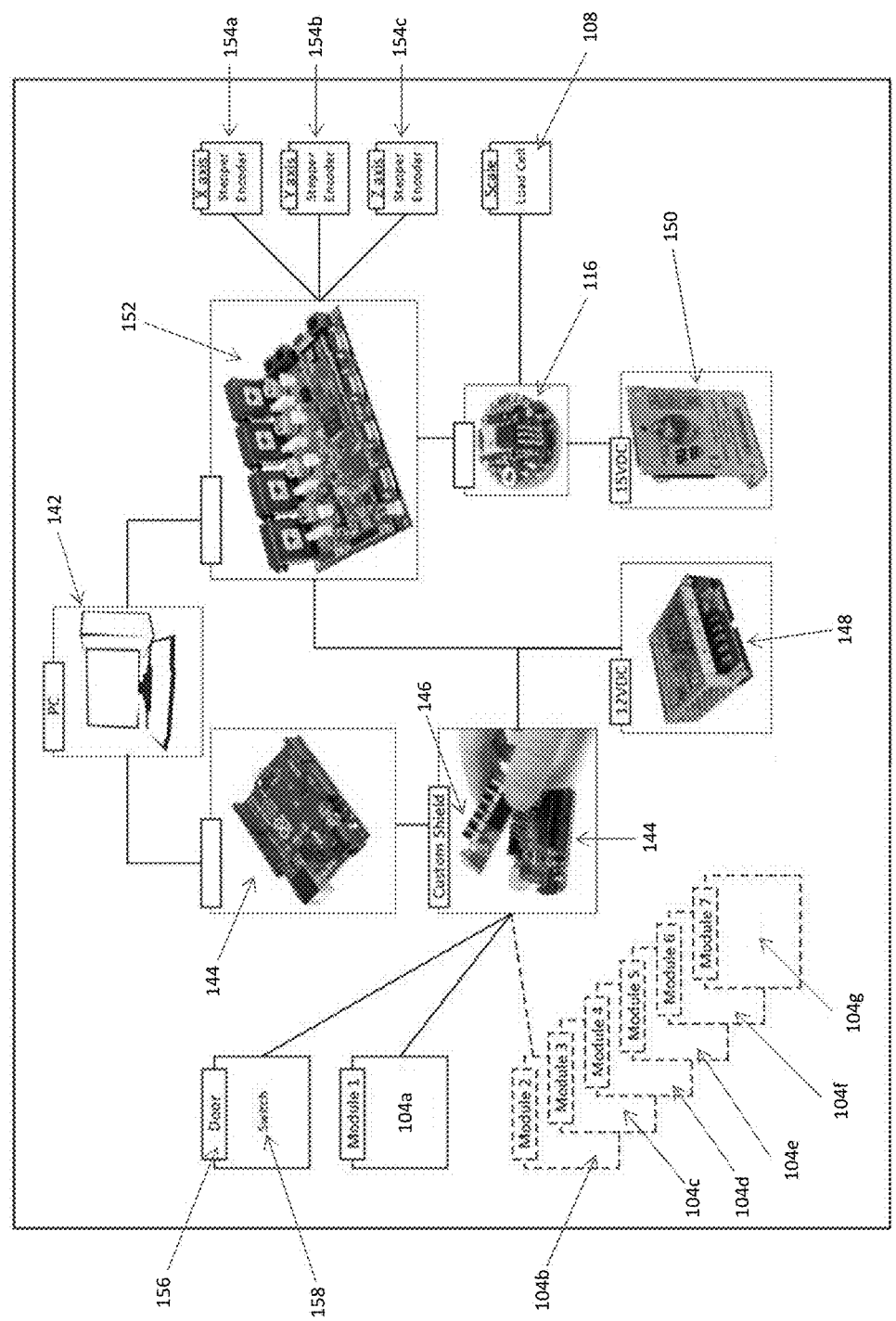
FIG. 13 shows, for one embodiment, an overall schematic of the electronic component and configuration and modules used FIG. 14(a-c) shows an embodiment of an actual fabricated instrument (a) front view with enclosure, (b) side view, and (c) front view with open enclosure around the multi-axis stages.

FIG. 13 shows an overall schematic of the electronic component and configuration and modules used to run this versatile and compact micro and nano lithography instrument.

Figure 14A:
Figure 14B:
Figure 14C:

FIG. 14 (a-c) shows an actual engineering of the instrument, in a working example, that included the enclosure around the multi-axis stage assembly and electronics.

The following listings correlate for the FIGS. 1-14 the element numbers with the name of the elements.

| Element # | Description |
| --- | --- |
| 100 | Microfabrication and/or nanofabrication device (or instrument or apparatus) |
| 102 | Device cover |
| 104 | Module |
| 104a | Module with photolithography, nano-imprint lithography, and microcontact printing capabilities for microfabrication and/or nanofabrication |
| 104b | Module capable of performing at least one given microfabrication and/or nanofabrication |
| 104c | Module capable of performing at least one given microfabrication and/or nanofabrication |
| 104d | Module capable of performing at least one given microfabrication and/or nanofabrication |
| 104e | Module capable of performing at least one given microfabrication and/or nanofabrication |
| 104f | Module capable of performing at least one given microfabrication and/or nanofabrication |
| 104g | Module capable of performing at least one given microfabrication and/or nanofabrication |
| 106 | Stage |
| 108 | Load cell |
| 110 | Inner spring |
| 112 | Outer spring |
| 114 | z-axis assembly cover |
| 116 | Load cell amplifier |
| 118 | Encoder |
| 120 | xy-axis assembly side protection cover |
| 121 | xy-axis assembly |
| 122 | xy-axis assembly top protection cover |
| 124 | LED Housing |
| 126 | UV LEDs |
| 128 | Spacers (sets correct distance from the substrate) |
| 130 | Mask/Stamp |
| 132 | Float plate |
| 134 | Stamp holder |
| 138 | Glass slide coated with UV-curable photoresist |
| 142 | PC |
| 144 | Module interface board |
| 146 | Custom shield |
| 148 | 12 Volt DC Power Supply |
| 150 | 15 Volt DC Power Supply |
| 152 | Commercial controller for positioning |
| 154a | x-axis stepper encoder |
| 154b | y-axis stepper encoder |
| 154c | z-axis stepper encoder |
| 156 | Door |
| 158 | Switch |

Microcontact Printing Working Example:

A working example is provided for use of the microfabrication and/or nanofabrication device comprising a hardware platform with at least one multi-axis positioning stage including electronic control of the stage, wherein the hardware platform is also adapted to receive an exchangeable module head adapted to carry out microcontact printing as the at least one microfabrication and/or nanofabrication method, as illustrated in FIGS. 1-14.

1. Fabrication of PDMS Stamp: A PDMS mold (FIG. 15) was created using a molded plastic sheet from Sharklet. The sheet was made by hot embossing using a nickel mold. The liquid PDMS was poured onto the plastic sheet with the Sharklet structures and cured for 2 hours between 70-90° C.

2. The PDMS stamp was then bonded to a 2 mm thick Pyrex holder using a drop of liquid PDMS and curing it for 40 min at 80° C. in an oven.

Figure 16:
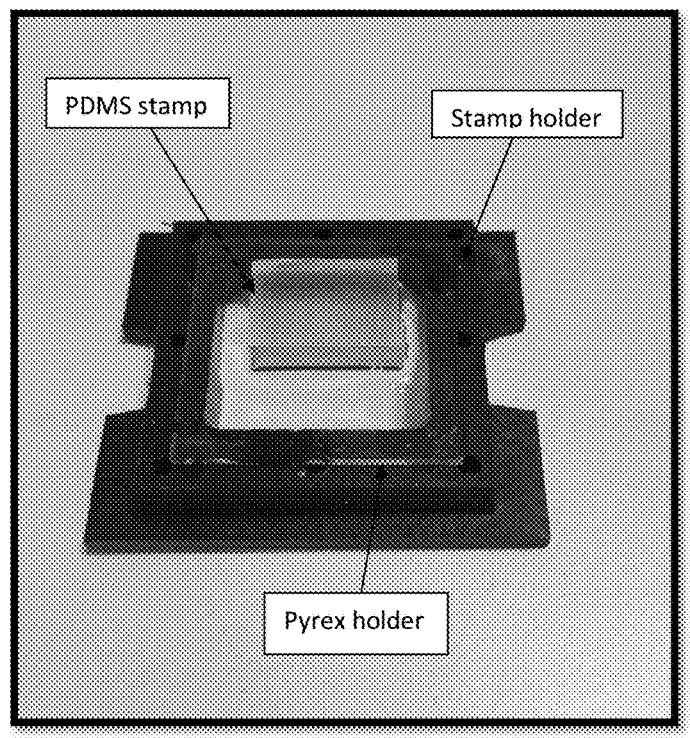
FIG. 16 shows for an embodiment for microcontact printing of a PDMS stamp mounted on a pyrex holder which is mounted on a stamp holder.

3. The above PDMS+Pyrex assembly was then glued onto the stamp holder (FIG. 16) so that it can be used with the fabrication instrument.

4. The PDMS was then coated with thiol molecules which were printed onto a gold substrate using the instrument using a software following the execution steps highlighted below.

5. The 20 nm gold substrate (substrate consists of 10 nm thin titanium thermally evaporated onto a silicon substrate followed by 25 nm deposition of thermally evaporated gold) is placed in a gold etching solution for 17 minutes followed by quenching in distilled water and dried.

6. The printed thiol molecules onto the gold substrates act as a resist layer this resulting in gold structures same as the starting mold (FIG. 17).

Figure 18:
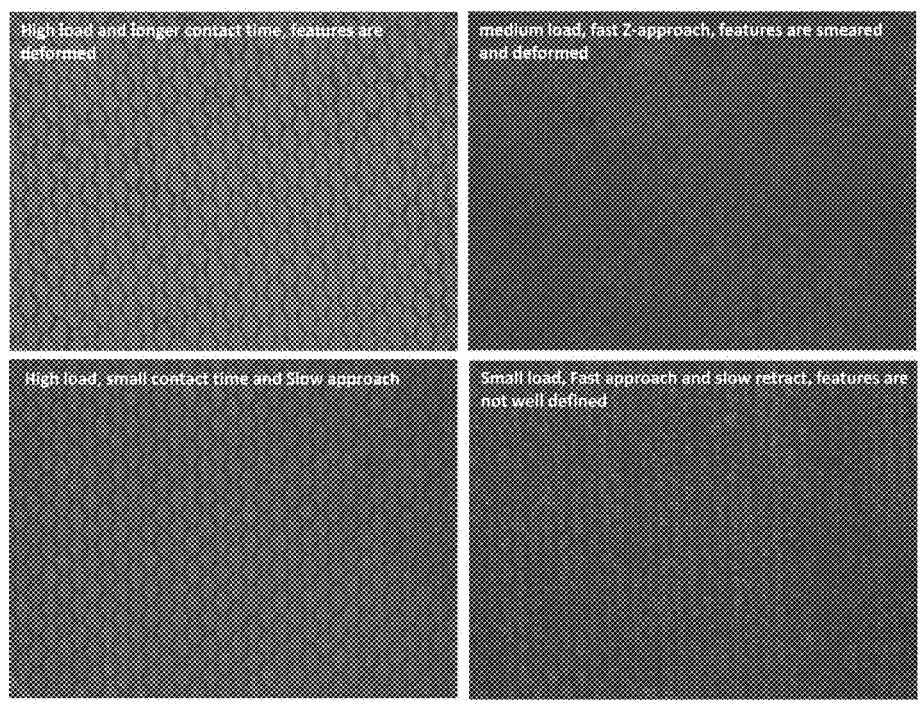
FIG. 18 shows examples of microcontact printing result in experimenting with different loads, approaches and retractions, and contact times.

7. Upon characterization of fabricated gold structures, it was found during experimentation that precise control over Z-axis movement (including controlled contact and retract) was important to apply a small load for exact durations to get features with high spatial resolution. The highly flexible Z-axis with built in capability to detect very small load in COSMOS allowed a soft contact, controlled application of load and fast retract (once the contact time was up) allowed high feature resolution as shown. When tried without these controls, the resulting structures were smeared and deformed to form a larger structures than the intended due to the deformation of the elastic stamp (FIG. 18). FIG. 18a shows an example of high load and longer contact time, which produced deformed features. FIG. 18b shows an example of medium load with a fast Z approach, and the features were smeared and deformed. In FIG. 18c, a high load, small contact time, and slow approach produced result which were not as favorable as desired. In FIG. 18d, the features were not well defined when a small load, fast approach, and slow retract were used.

In sum, the instrument can be used to produce useful structures, conduct research, and also to train persons on how to set instrumental parameters to achieve objectives and avoid failure.

Microcontact Printing (μCP) execution steps (noted in point 4 above)

The instrument is provided with a user interface to control printing. The user can press and set "idle" parameters, press "go", press "pause", or press "reset" to control printing. The idle parameters include:
  target load (e.g., 40 g),
  contact time (e.g., 6 sec),
  Z fast approach speed (e.g., 2134 microns/sec),
  Z slow approach speed (e.g., 100 microns/sec),
  Z slow approach point (500 microns),
  Z retract point (2,500 microns),
  Z slow retract speed (600 microns/sec),
  Z fast retract speed (2,500 microns/sec),
  apply load speed (1,000 microns/sec),
  apply load acceleration (1,000 microns/sec$^2$), and
  load differential (95 g).

Charts showing distance (Z, microns), velocity (microns/sec), and load (g) were developed to monitor the printing as it progresses.

Execution Sequence:
  1. Technique is Idle;
  2. User presses GO button;
  3. Z axis moves to the point where Target Load is reached, executing motion profile defined below;
  4. Z axis stops. Times starts.

5. When timer is done, Z axis moves to Retract Z point, executing motion profile defined below;
6. Sequence is Done;
7. Technique is back to Idle.

Claims Of US Priority Provisional Application 62/027,676

The priority provisional application 62/027,676 filed Jul. 22, 2014 is hereby incorporated by reference in its entirety including detailed description, working examples, figures, and claims.

A first aspect provides for a microfabrication and/or nanofabrication device comprising a hardware platform with at least one multi-axis positioning stage including electronic control of the stage, wherein the hardware platform is also adapted to receive an exchangeable module head adapted to carry out at least one microfabrication and/or nanofabrication method.

In one embodiment, the device further comprises a cover for the hardware platform for UV protection and safety from mechanical components.

In one embodiment, the microfabrication and/or nanofabrication method comprises at least one of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least one of photolithography, UV nanoimprint lithography, and/or microcontact printing.

In one embodiment, the microfabrication and/or nanofabrication method comprises at least one of hot embossing and/or hot nanoimprint lithography.

In one embodiment, the microfabrication and/or nanofabrication method comprises at least one of 3D printing and stereolithography.

In one embodiment, the microfabrication and/or nanofabrication method comprises at least two of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least three of photolithography, UV nanoimprint lithography, microcontact printing, hot embossing, hot nanoimprint lithography, micro-arraying, two-dimensional UV lithography, three-dimensional printing, stereo lithography, and/or scanning probe lithography.

In one embodiment, the microfabrication and/or nanofabrication method comprises at least scanning probe lithography, wherein the scanning probe lithography comprises at least one of dip pen nanolithography, nanografting, nanoshaving, and/or nanoindentation.

In one embodiment, the microfabrication and/or nanofabrication method comprises photolithography, and the module comprises at least one UV source and at least one mask assembly.

In one embodiment, the at least one multi-axis positioning stage comprises at least three axes for positioning.

In one embodiment, the at least one multi-axis positioning stage includes a z-axis stage and an x-y stage.

In one embodiment, the device further comprises at least one encoder.

In one embodiment, the device further comprises at least one amplifier.

In one embodiment, the device further comprises a viewing assembly.

In one embodiment, the device further comprises a load cell.

In one embodiment, the device further comprises at least one LED.

In one embodiment, the device further comprises a camera.

A second aspect is an exchangeable module head which, when used in conjunction with a microfabrication and/or nanofabrication device according to the first aspect, is capable of performing at least one microfabrication and/or nanofabrication technique.

In one embodiment, the at least one microfabrication and/or nanofabrication technique is comprised of at least one of: photolithography, UV nanoimprint lithography, microcontact printing, hot embossing, hot nanoimprint lithography, micro-arraying, two-dimensional UV lithography, three-dimensional printing, stereo lithography, or scanning probe lithography.

In one embodiment, the at least one microfabrication and/or nanofabrication technique is comprised of at least two of: photolithography, UV nanoimprint lithography, microcontact printing, hot embossing, hot nanoimprint lithography, micro-arraying, two-dimensional UV lithography, three-dimensional printing, stereo lithography, or scanning probe lithography.

In one embodiment, the at least one microfabrication and/or nanofabrication technique is comprised of hot embossing and hot nanoimprint lithography.

In one embodiment, the at least one microfabrication and/or nanofabrication technique is comprised of at least three of: photolithography, UV nanoimprint lithography, microcontact printing, hot embossing, hot nanoimprint lithography, micro-arraying, two-dimensional UV lithography, three-dimensional printing, stereo lithography, or scanning probe lithography.

In one embodiment, the at least one microfabrication and/or nanofabrication technique is comprised of photolithography, microcontact printing, and nanoimprint lithography.

A third aspect is a method of microfabrication and/or nanofabrication, comprising engaging the device of the first aspect with the exchangeable module head and carrying out the microfabrication and/or nanofabrication.

In one embodiment, the method further comprises using software to direct the device and exchangeable module head to perform at least one microfabrication and/or nanofabrication technique.

In one embodiment, the method further comprises inserting the exchangeable module head.

In one embodiment, the method further comprises engaging the device of the first aspect with second, different exchangeable module head.

A fourth aspect provides for an exchangeable module head adapted to perform at least one nanofabrication and/or microfabrication method.

What is claimed is:

1. A microfabrication and/or nanofabrication device comprising:
   a hardware platform with at least one multi-axis positioning stage including electronic control of the at least one multi-axis positioning stage;
   wherein the hardware platform is also adapted mechanically and electrically to receive a first exchangeable module head which is mechanically and electrically adapted to carry out at least one microfabrication and/or nanofabrication method;
   a second different exchangeable module head mechanically and electrically adapted to carry out at least one different microfabrication and/or nanofabrication method, whereby the user of the device also can switch between the different microfabrication and/or nanofabrication methods by removing the first exchangeable module head and replacing it with the second different exchangeable module head, or by removing the second different exchangeable module head and replacing it with the first exchangeable module head; wherein either of the first exchangeable module head and the second different module head include multiple components in addition to a mold or stamper; and wherein the microfabrication and/or nanofabrication methods provided by the first and second different exchangeable module heads comprise at least two of photolithography, UV nanoimprint lithography, micro contact printing, hot embossing, hot nanoimprint lithography, micro-arraying, two-dimensional UV lithography, three-dimensional printing, stereo lithography, and/or scanning probe lithography.

2. The device of claim 1, wherein the device further comprises a cover for the hardware platform for UV protection and safety from mechanical components.

3. The device of claim 1, wherein the microfabrication and/or nanofabrication methods each comprise photolithography, UV nanoimprint lithography, and/or microcontact printing.

4. The device of claim 1, wherein the microfabrication and/or nanofabrication methods each comprise hot embossing and/or hot nanoimprint lithography.

5. The device of claim 1, wherein the microfabrication and/or nanofabrication methods each comprise 3D printing and stereolithography.

6. The device of claim 1, wherein the microfabrication and/or nanofabrication methods each comprise scanning probe lithography, wherein the scanning probe lithography comprises at least one of dip pen nanolithography, nanografting, nanoshaving, and/or nanoindentation.

7. The device of claim 1, wherein the microfabrication and/or nanofabrication methods each comprise photolithography, and the module comprises at least one UV source and at least one mask assembly.

8. The device of claim 1, wherein the microfabrication and/or nanofabrication methods each comprise tip bias or AFM bias lithography.

9. The device of claim 1, wherein the at least one multi-axis positioning stage comprises at least three axes for positioning.

10. The device of claim 1, wherein the at least one multi-axis positioning stage includes a z-axis stage and an x-y stage.

11. The device of claim 1, wherein the at least one multi-axis positioning stage is adapted to allow for rotation and/or tilt.

12. The device of claim 1, wherein the device further comprises a viewing assembly.

13. The device of claim 1, wherein the device further comprises a load cell.

14. The device of claim 1, wherein the device further comprises at least one LED or a camera.

15. The device of claim 1, wherein the first exchangeable module head is mechanically and electrically adapted to carry out photolithography and comprises a mask holder and a UV source.

* * * * *